(12) United States Patent
Tang

(10) Patent No.: US 8,760,169 B2
(45) Date of Patent: Jun. 24, 2014

(54) OPERATIONAL AMPLIFIER WITH DIFFERENT POWER SUPPLY VOLTAGES

(75) Inventor: Xiaohu Tang, Shanghai (CN)

(73) Assignee: 02Micro, Inc., Santa Clara, CA (US)

( * ) Notice: Subject to any disclaimer, the term of this patent is extended or adjusted under 35 U.S.C. 154(b) by 357 days.

(21) Appl. No.: 13/226,064

(22) Filed: Sep. 6, 2011

(65) Prior Publication Data

US 2013/0043877 A1    Feb. 21, 2013

(30) Foreign Application Priority Data

Aug. 19, 2011    (CN) .......................... 2011 1 0241731

(51) Int. Cl.
*G01N 27/416*    (2006.01)
(52) U.S. Cl.
USPC .......................................................... 324/434
(58) Field of Classification Search
USPC .......................................................... 324/434
See application file for complete search history.

(56) References Cited

U.S. PATENT DOCUMENTS

| | | | |
|---|---|---|---|
| 6,504,435 B1 * | 1/2003 | Martins ......................... | 330/292 |
| 7,196,581 B2 * | 3/2007 | Gammie et al. .............. | 330/259 |
| 2003/0052688 A1 * | 3/2003 | Yudahira et al. .............. | 324/429 |
| 2003/0128072 A1 * | 7/2003 | Tran et al. ..................... | 330/255 |
| 2005/0225391 A1 * | 10/2005 | Zhang et al. .................. | 330/264 |
| 2012/0007603 A1 * | 1/2012 | Zhang .......................... | 324/434 |

* cited by examiner

Primary Examiner — Arun Williams (57) ABSTRACT

An operational amplifier with different power supply voltages includes an input stage and an output stage. The input stage includes a current source for providing a bias current, and a differential input circuit for receiving the bias current and differential input voltage signals, and converting the differential input voltage signal to differential input currents. The input stage is supplied by a first power supply voltage. The output stage includes a load circuit coupled to the differential input voltage signal and for receiving the differential input currents, and outputting a single ended output voltage signal. The output stage is supplied by a second power supply voltage. The second power supply voltage is lower than the first power supply voltage.

16 Claims, 7 Drawing Sheets

OPERATIONAL AMPLIFIER WITH DIFFERENT POWER SUPPLY VOLTAGES

RELATED APPLICATION

This application claims priority to Chinese Patent Application No. 201110241731.1, titled "Operational Amplifier for Controlling Power Source and Battery Management System," filed on Aug. 19, 2011, with the State Intellectual Property Office of the People's Republic of China.

BACKGROUND

A conventional operational amplifier typically includes an input stage and an output stage. The input stage receives differential input signals, and the output stage converts the differential input signals to a single-ended output signal. The input stage and the output stage are powered by a common power supply. For example, in a voltage measuring system, the conventional operational amplifier can be used to detect cell voltages of a multi-cell battery. If a common-mode input voltage level at an inverting input terminal and a non-inverting input terminal is higher than a first value, e.g., 5V, both the input stage and the output stage should be powered by a high-voltage power supply voltage, e.g., 18V, which is higher than the common-mode input voltage. Therefore, both the input stage and the output stage should use high-voltage transistors. A high-voltage transistor is a transistor with an operating voltage threshold larger than the high-voltage power supply voltage, e.g., 18V. Operation above the operating voltage threshold can degrade the reliability of or damage the transistor.

Typically, high-voltage transistors are large in size and have large parasitic parameters, so their use in an operational amplifier will increase the size of the operational amplifier and diminish its performance. Furthermore, it is difficult to shut off high-voltage transistors because their gate-source voltage threshold $V_{GS}$ is less than a second voltage level, e.g., 12V. Therefore, in conventional operational amplifiers, a level-shift circuit is employed to convert a low-voltage control signal to a high-voltage control signal, which is applied at the gates of the high-voltage transistors to shut them off. The level shift circuit further increases the size of operational amplifiers, and also increases their cost. Moreover, the level-shift circuit continues to function after the operational amplifier is shut down, which increases power consumption.

SUMMARY

In one embodiment, an operational amplifier with different power supply voltages includes an input stage and an output stage. The input stage includes a first current source and a differential input circuit. The first current source generates a first bias current. The differential input circuit receives the first bias current and differential input voltage signals, and converts the differential input voltage signals to differential input currents. The input stage is supplied by a first power supply voltage. The output stage includes a load circuit. The load circuit is coupled to the differential input circuit for receiving the differential input currents and outputting a single-ended output voltage signal. The output stage is supplied by a second power supply voltage. The second power supply voltage is lower than the first power supply voltage.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Embodiments in accordance with the present invention provide operational amplifiers with different power supply voltages. In one embodiment, an operational amplifier includes an input stage and an output stage. The input stage includes a first current source and a differential input circuit. The first current source generates a first bias current. The differential input circuit receives the first bias current and differential input voltage signals, and converts the differential input voltage signals to differential input currents. The input stage is supplied by a first power supply voltage. The output stage includes a load circuit. The load circuit is coupled to the differential input circuit for receiving the differential input currents, and outputting a single-ended output voltage signal. The output stage is supplied by a second power supply voltage. The second power supply voltage is lower than the first power supply voltage.

Figure 1:
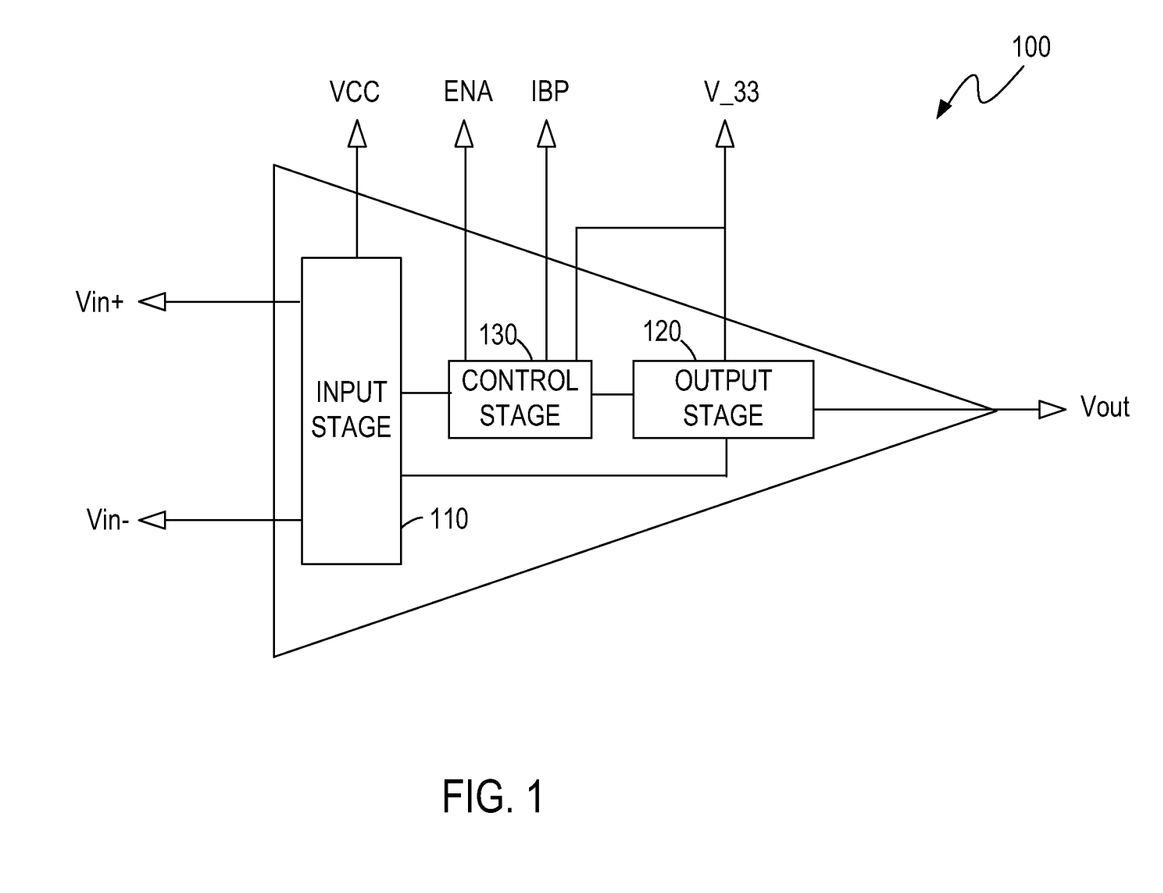
FIG. 1 illustrates a block diagram of an operational amplifier according to one embodiment of the present invention.

FIG. 1 illustrates a block diagram of an operational amplifier 100 according to one embodiment of the present invention. In the example of FIG. 1, the operational amplifier 100 includes an input stage 110, an output stage 120, and a control stage 130. The input stage 110 receives and converts differential input voltage signals Vin+ and Vin− to differential input currents. The input stage 110 is powered by a first power supply voltage VCC. The output stage 120 receives the differential input currents so to amplify and convert the differential input voltage signals Vin+, Vin− to a single-ended output voltage signal Vout. The output stage 120 is powered by a second power supply voltage V_33. The second power supply voltage V_33 is lower than the first power supply voltage VCC. In one embodiment, the control stage 130 receives an enable signal ENA and a bias current IBP to control the input stage 110 and the output stage 120.

Thus, the input stage 110 and output stage 120 are advantageously powered by different power supply voltages. Therefore, compared to conventional techniques, it is not necessary to employ an additional level-shift circuit. As a result, the size, power consumption and cost of the operational amplifier 100 are reduced.

Figure 2:
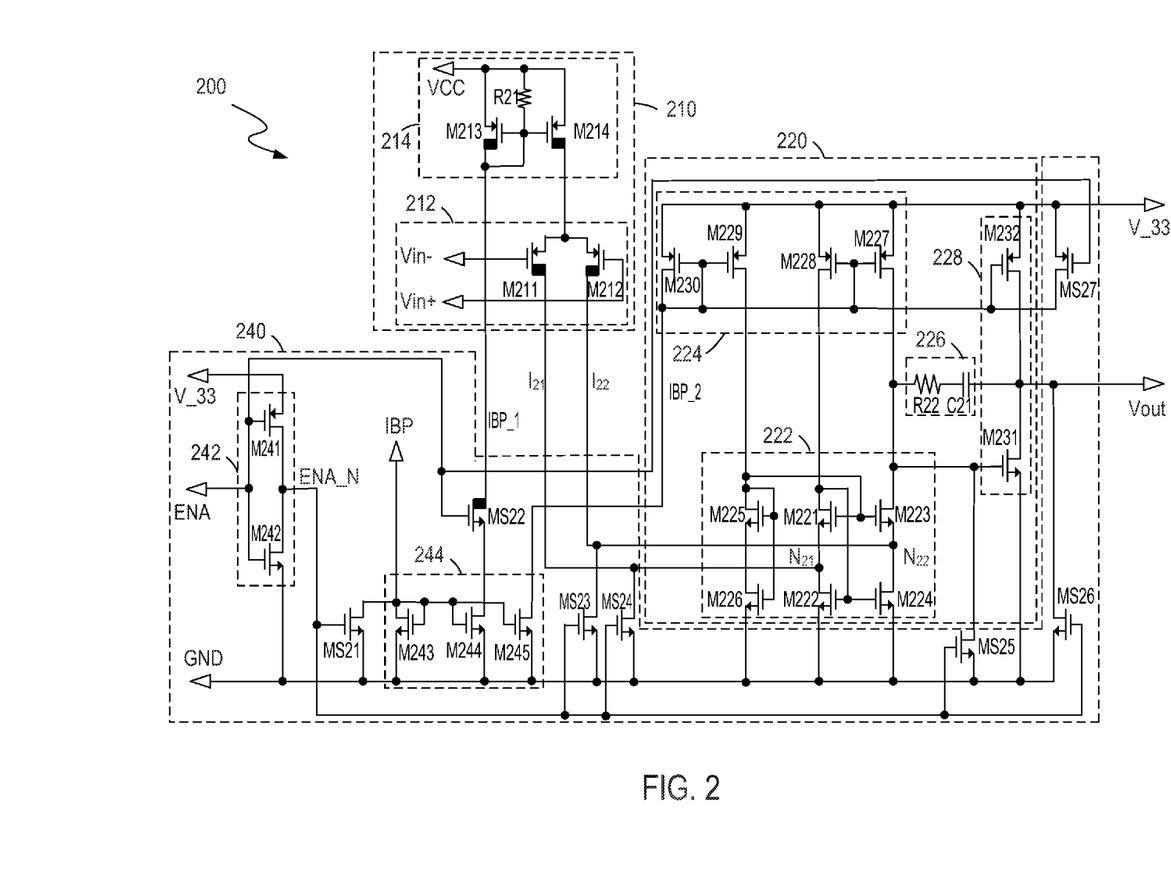
FIG. 2 illustrates a schematic diagram of an operational amplifier according to a first embodiment of the present invention.

FIG. 2 illustrates a schematic diagram of an operational amplifier 200 according to one embodiment of the present invention. Elements labeled the same as in FIG. 1 have similar functions. In the example of FIG. 2, the operational amplifier 200 includes an input stage 210, an output stage 220, and a control stage 240. The input stage 210, output stage 220, and control stage 240 correspond to the input stage 110, output stage 120, and control stage 130 of FIG. 1.

In the FIG. 2 embodiment, the input stage 210 receives differential input voltage signals Vin+ and Vin−, and converts the differential input voltages Vin+ and Vin− to differential input currents $I_{21}$, $I_{22}$ to the output stage 220. The input stage 210 is supplied with a first power supply voltage VCC, e.g., 18V. In one embodiment, the input stage 210 includes a plurality of transistors M211-M214. The output stage 220 receives the differential input currents $I_{21}$, $I_{22}$ from the input stage 210 and converts the differential input voltage signals Vin+ and Vin− to a single-ended output voltage signal Vout. The output stage 220 is supplied with a second power supply voltage V_33, e.g., 3.3V, which is less than the first power supply voltage VCC. In one embodiment, the output stage 220 includes a plurality of transistors M221-M230. In one embodiment, the transistors can be, but are not limited to, metal-oxide-semiconductor field-effect transistors (MOSFET) or bipolar junction transistors (BJT).

In one embodiment, the transistors M211-M214 in the input stage 210 are high-voltage transistors, and the transistors M221-M230 in the output stage 220 are low-voltage transistors. The operating voltage threshold of the high-voltage transistor is higher than the operating voltage threshold of the low-voltage transistor. As used herein, the operating voltage threshold is defined as a voltage level above which the reliability of the transistor is degraded or above which the transistor may be damaged or destroyed. In one embodiment, the operating voltage threshold is the maximum withstand voltage that can be applied between the drain and source of a MOSFET without undue risk of harming the MOSFET. In one embodiment, the operating voltage threshold is the maximum withstand voltage that can be applied between the collector and emitter of a BJT without undue risk of harming the BJT. In one embodiment, a maximum withstand voltage between the drain and source of a high-voltage MOSFET is about 60V, and the maximum withstand voltage between drain and source of a low-voltage MOSFET is about 5.5V. In one embodiment, the area and parasitic parameters of the high-voltage transistors are larger than the area and parasitic parameters of the low-voltage transistor.

In one embodiment, the input stage 210 includes a differential input circuit 212 that includes the transistors M211 and M212, and a current source 214 that includes the transistor M213 and M214. In one embodiment, the gate of the transistor M211 receives the differential input voltage signal Vin−, and the gate of the transistor M212 receives the differential input voltage signal Vin+. Drains of the transistors M211, M212 are coupled to the output stage 220. The transistors M211, M212 convert the differential input voltage signals Vin+ and Vin− to the differential input currents $I_{21}$, $I_{22}$ for the output stage 220. Commonly coupled sources of the transistors M211-212 are coupled to the current source 214. In one embodiment, sources of the transistors M213-M214 are commonly coupled, and the first power supply voltage VCC is applied to the commonly coupled sources. Gates of the transistors M213-M214 are commonly coupled and receive first power supply voltage VCC via a push-pull resistor R21. The push-pull resistor R21 is used to shut off the current source 214 when the operational amplifier 200 is in an off state, which will be further described below. The drain of the transistor M213 is coupled to the control stage 240 to receive a bias current IBP_1 provided by the control stage 240, and is also coupled to the commonly coupled gates of the transistors M213 and M214 to constitute a current mirror circuit. In the current source 214, the bias current IBP_1 through the transistor M213 is mirrored by the transistor M214 and provided to the differential input circuit 212. In one embodiment, the transistors M211-M214 are P-type MOSFETs.

In one embodiment, the output stage 220 includes a load circuit 222 and a current source 224. In one embodiment, the load circuit 222 includes the transistors M221-M226. Sources of the transistors M221, M223, and M225 are coupled to drains of the transistors M222, M224 and M226, respectively. A connection point N21 between the source of the transistor M221 and the drain of the transistor M222, and a connection point N22 between the source of the transistor M223 and the drain of the transistor M224, receive the differential input currents $I_{21}$, $I_{22}$ from the input stage 210, respectively. Sources of the transistors M222, M224, M226 are grounded. Commonly coupled gates of the transistors M221, M223 are coupled to drain of the transistor M225 to implement a current mirror. The drain of the transistor M225 is also coupled to commonly coupled gates of the transistors M225 and M226. Commonly coupled gates of the transistors M222 and M224 are coupled to drain of the transistor M221. Therefore, the load circuit 222 is implemented as a folded cascade connection circuit, and the current $I_{21}$ at the connection point N21 is mirrored and added to the current $I_{22}$ at the connection point N22. The load circuit 222 receives the differential input currents $I_{21}$, $I_{22}$ and outputs a single-ended output voltage signal Vout. In one embodiment, the load circuit 222 increases a gain of the operational amplifier 200 to amplify the differential input voltage signals Vin+ and Vin− based on the differential input currents $I_{21}$, $I_{22}$. In one embodiment, the transistors M221-M226 are N-type MOSFETs.

In one embodiment, the current source 224 includes transistors M227-M230. The second power supply voltage V_33 is applied to commonly coupled sources of the transistors M227-M230. Commonly coupled gates of the transistors M227, M228 are coupled to commonly coupled gates of the transistors M229, M230. The drain of the transistor M230 is coupled to the control stage 240 to receive a bias current IBP_2, and is also coupled to commonly coupled gates of transistors M227-M230 to implement a current mirror circuit. Drains of the transistors M227, M228, M229 are respectively coupled to drains of the transistors M223, M221, M225 and provide bias currents for the load circuit 222. In one embodiment, the transistors M227-M230 are P-type MOSFETs.

In one embodiment, the output stage 220 further includes a compensation circuit 226. In one embodiment, the compensation circuit 226 is a Miller compensation circuit, and includes a resistor R22 and a capacitor C21 in series. The compensation circuit 226 is coupled to the load circuit 222 to stabilize the single-ended output voltage signal Vout.

In one embodiment, the differential input circuit 212, the current source 214, the load circuit 222, and the current source 224 form a first stage amplifier. In one embodiment, the output stage 220 also includes a second stage amplifier 228 to further amplify the single-ended output voltage signal Vout. In one embodiment, the second stage amplifier 228 is a single-stage amplifier including transistors M231 and M232. The gate of the transistor M231 is coupled to the load circuit 222 to further amplify and output the single-ended output voltage signal Vout. The source of the transistor M231 is grounded. The drain of the transistor M231 is coupled to the drain of the transistor M232. In one embodiment, the source of the transistor M232 receives the second power supply voltage V_33. The gate of the transistor M232 is coupled to the gates of the transistors M227-M230. The drain of the transistor M232 is coupled to the drain of the transistor M231. The bias current IBP_2 through the transistor M230 is mirrored by the transistor M232 and provided to the transistor M231. Therefore, the transistor M232 functions as a current source. In one embodiment, the transistor M231 is N-type MOSFET and the transistor M232 is a P-type MOSFET.

In one embodiment, the control stage 240 receives an enable signal ENA and a bias current IBP, and provides bias currents IBP_1 and IBP_2 for the input stage 210 and the output stage 220, respectively. In one embodiment, the control stage 240 is supplied with the second power supply voltage V_33. In one embodiment, the control stage 240 includes the transistors M241-M245 and the switches MS21-MS28. In one embodiment, the transistors M241-M245 and the switches MS21, MS23-MS27 are low-voltage transistors, and the switch MS22 is a high-voltage transistor that can be used to isolate the first power supply voltage VCC and the second power supply voltage V_33.

In one embodiment, the control stage 240 includes an inverter 242, a current mirror circuit 244, and the switches MS21-MS27. In one embodiment, the inverter 242 includes the transistors M241, M242. Commonly coupled gates of the transistors M241, M242 receive an enable signal ENA. Commonly coupled drains of the transistors M241, M242 output an inverted enable signal ENA_N. The second power supply voltage V_33 is applied to the source of the transistor M241. The source of the transistor M242 is grounded. In one embodiment, the transistor M241 is a P-type MOSFET and the transistor M242 is an N-type MOSFET.

In one embodiment, the current mirror circuit 244 includes the transistors M243-M245. The sources of the transistors M243-M245 are grounded. The gates of the transistors M243-M245 are commonly coupled. The drain of the transistor M243 is also coupled to the commonly coupled gates of the transistors M243-M245 to form a current mirror. The drain of the transistor M244 is coupled to the source of the switch MS22. The bias current IBP through the transistor M243 is mirrored by the transistor M244 to provide the bias current IBP_1 for the current source 214 via the switch MS22. The bias current IBP through the transistor M243 is also mirrored by the transistor M245 to provide the bias current IBP_2 for the current source 224. The drain of the transistor M245 is coupled to the current source 224. In one embodiment, the transistors M243-M245 are N-type MOSFETs.

In one embodiment, the switch MS21 is provided and can be used to control the current mirror circuit 244. The gate of the switch MS21 receives the inverted enable signal ENA_N. The source of the switch MS21 is grounded. In one embodiment, the current mirror circuit 244 is powered by the second power supply voltage V_33, the current source 214 is powered by the first power supply voltage VCC, and the switch MS22 can be used to isolate the first power supply voltage VCC and the second power supply voltage V_33 and also be used to control the bias current IBP_1 delivered to the current source 214. The gate of the switch MS22 receives the enable signal ENA. The drain of the switch MS22 is coupled to current source 214. In one embodiment, commonly coupled gates of the switches MS23 and MS24 receive the inverted enable signal ENA_N to control the load circuit 222. The sources of the switches MS23 and MS24 are grounded. The drain of the switch MS23 is coupled to the connection point N22 of the transistors M223 and M224. The drain of the switch MS24 is coupled to the connection point N21 of the transistors M221 and M222. The switch MS25 can be used to control the transistor M331. The gate of the switch MS25 receives the inverted enable signal ENA_N. The source of the switch MS25 is grounded. The drain of the switch MS25 is coupled to the transistor M231. The switch MS26 can be used to control the singled-ended output voltage signal Vout. The gate of the switch MS26 receives the inverted enable signal ENA_N. The source of the switch MS26 is grounded. The drain of the switch MS26 is coupled to the drain of the transistor M231. The switch MS27 can be used to control the current source 224 and the transistor M232. The gate of the switch MS27 receives the enable signal ENA. The source of the switch MS27 receives the second power supply voltage V_33. The drain of the switch MS27 is coupled to the commonly coupled gates of the transistors M227-M230 and M232. In one embodiment, the switches MS21-MS26 are N-type MOSFETs, and the switch MS27 is a P-type MOSFET.

In operation, when the enable signal ENA is set to a first voltage level, e.g., 3.3V, and the inverted enable signal ENA_N is inverted to a second voltage level, e.g., 0V, the switch MS22 is turned on, and the switches MS21, MS23-MS27 are turned off, and thereby the current mirror circuit 244 is turned on. The bias current IBP_1 output from the current mirror circuit 244 is enabled by the switch MS22 and delivered to the first current source 214, and the bias current IBP_2 output from the current mirror circuit 244 is also provided to the second current source 224, so that the operational amplifier 200 is in a working state. When the enable signal ENA is set to the second voltage level (e.g., 0V), and the inverted enable signal ENA_N is inverted to the first voltage level (e.g., 3.3V), the switch MS22 is turned off, and the switches MS21, MS23-27 are turned on, and thereby the current mirror circuit 244, the load circuit 222, the current source 224, the amplifier 228 are turned off. The bias current IBP_1 is prevented by the switch MS22 from being delivered to the first current source 214, and the bias current IBP_2 output from the current mirror circuit 244 also cannot be provided to the second current source 224. The current source 214 is turned off by the resistor R21. The operational amplifier 200 is in an off state.

Advantageously, by using the high-voltage transistors in the input stage 210 and using the low-voltage transistors in the output stage 220, and supplying the first power supply voltage VCC for the input stage 210 and supplying the second power supply voltage V_33 for output stage 220, the input stage 210 and output stage 220 are powered by different power supply voltages. Compared to conventional techniques, it is not necessary to employ an additional level-shift circuit to increase a voltage level of the enable signal ENA to control the transistors in the input stage 210 and the output stage 220. As a result, the area, the cost, and the power consumption of the operational amplifier 200 are reduced. Furthermore, since the output stage 220 employs low-voltage transistors, parasitic parameters are reduced and the performance of the operational amplifier 200 is improved.

Figure 3:
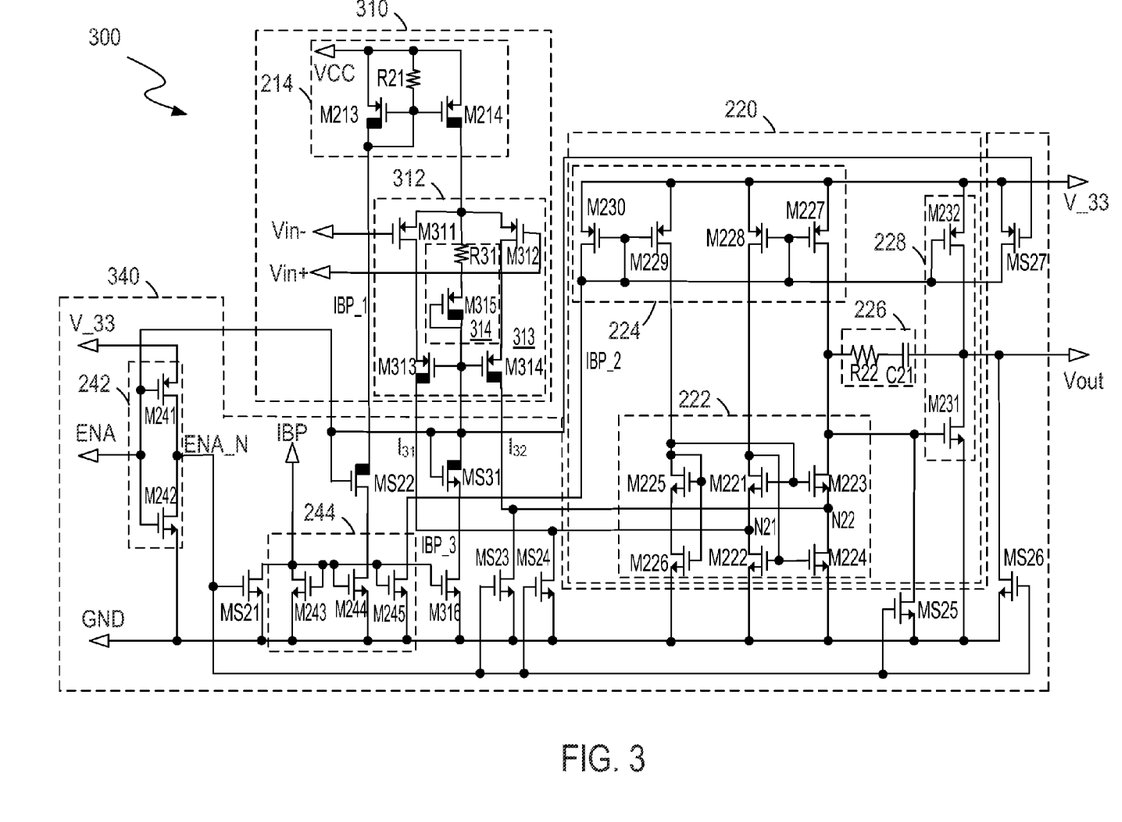
FIG. 3 illustrates a schematic diagram of an operational amplifier according to a second embodiment of the present invention.

FIG. 3 illustrates a schematic diagram of an operational amplifier 300 according to one embodiment of the present invention. Elements labeled the same as in FIGS. 1-2 have similar functions. In the example of FIG. 3, the operational amplifier 300 includes an input stage 310, the output stage 220, and a control stage 340. The input stage 310, output stage 220, and control stage 340 correspond to the input stage 110, output stage 120, and control stage 130 of FIG. 1.

In comparison to the operational amplifier 200, the operational amplifier 300 includes a differential input circuit 312 in the input stage 310. The differential input circuit 312 is a cascade differential input circuit and includes transistors M311-M315. In one embodiment, the transistors M311-M312 are low-voltage transistors and the transistors M313-M315 are high-voltage transistors. The differential input circuit 312 includes a cascade circuit 313 and a bias voltage circuit 314. The cascade circuit 313 includes the transistors M311-M314. The gates of the transistors M311, M312 receive differential input voltage signals Vin− and Vin+, respectively. Commonly coupled sources of the transistors M311, M312 are coupled to the current source 214 to receive a bias current. The drains of the transistors M311, M312 are coupled to the sources of the transistors M313, M314. The drains of the transistors M313, M314 are coupled to the output stage 220. The cascade circuit 313 converts the differential input voltage signals Vin+ and Vin− to differential input currents $I_{31}$, $I_{32}$ for the output stage 220. Commonly coupled gates of the transistors M313, M314 are coupled to the bias voltage circuit 314. The bias voltage circuit 314 includes a resistor R31 and the transistor M315, and is configured to provide a bias voltage at the gates of the transistors M313 and M314. The source of the transistor M315 is coupled to commonly coupled gates of the transistors M311 and M312 via the resistor R31. The gate and drain of the transistor M315 are coupled to the commonly coupled gates of the transistors M313, M314. In one embodiment, the transistors M311-M315 are P-type MOSFETs.

In comparison to the control stage 240 in FIG. 2, the control stage 340 includes a switch MS31 and a transistor M316. In one embodiment, the switch MS31 is a high-voltage transistor and the transistor M316 is a low-voltage transistor. The gate of the transistor M316 is coupled to the commonly coupled gates of the transistors M243-M245. The bias current IBP through the transistor M243 is mirrored by the transistor M316 to provide a bias current IBP_3 for the bias circuit 314 via the switch MS31. The gate of the switch MS31 receives the enable signal ENA. In one embodiment, the switch MS31 and the transistor M316 are N-type MOSFETs.

Figure 4:
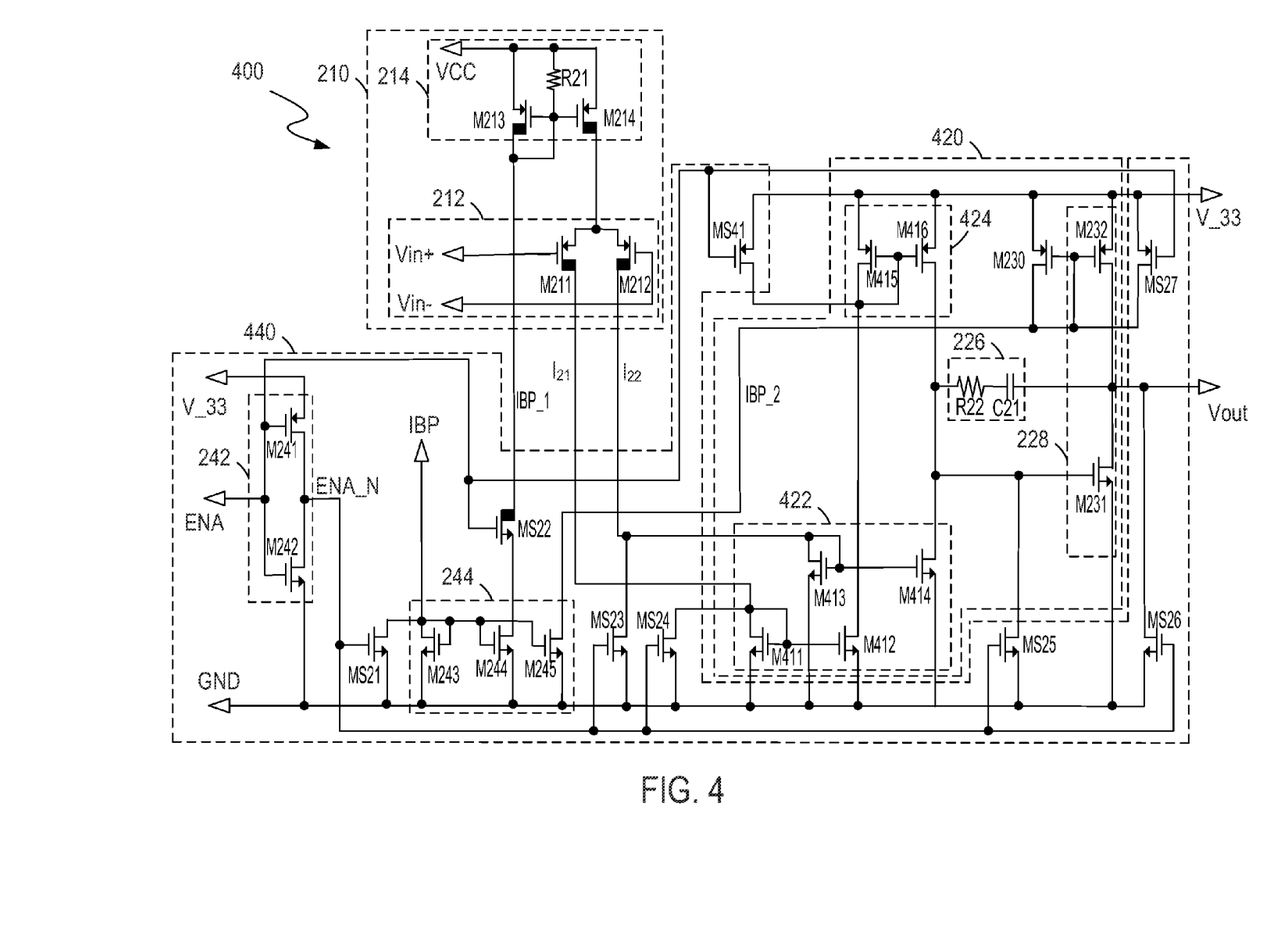
FIG. 4 illustrates a schematic diagram of an operational amplifier according to a third embodiment of the present invention.

FIG. 4 illustrates a schematic diagram of an operational amplifier 400 according to one embodiment of the present invention. Elements labeled the same as in FIGS. 1-3 have similar functions. In the example of FIG. 4, the operational amplifier 400 includes an input stage 210, an output stage 420, and a control stage 440. The input stage 210, output stage 420, and control stage 440 correspond to the input stage 110, output stage 120, and control stage 130 of FIG. 1.

In comparison to the output stage 220 in FIG. 2, a load circuit 422 in the output stage 420 includes a pair of current mirrors implemented using transistors M411-M414. In one embodiment, the transistors M411-M414 are low-voltage transistors. The sources of the transistors M411-M414 are grounded. The drain of the transistor M411 is coupled to the drain of the switch MS24, and is also coupled to commonly coupled gates of the transistors M411 and M412 to implement a first current mirror. The drain of the transistor M413 is coupled to the drain of the switch MS 23, and is also coupled to commonly coupled gates of the transistors M413 and M414 to implement a second current mirror. The drains of the transistors M411, M413 are coupled to the input stage 210 to receive the differential input currents $I_{21}$ and $I_{22}$. The load circuit 422 receives the differential input currents $I_{21}$, $I_{22}$, and outputs a single-ended output voltage signal Vout. In one embodiment, the load circuit 422 increases a gain of the operational amplifier 400 to amplify the differential input voltage signals Vin+ and Vin− based on the differential input currents $I_{21}$, $I_{22}$. In one embodiment, the transistors M411-M414 are N-type MOSFETs.

In comparison to the output stage 220 in the FIG. 2, a current source 424 provides a bias current for the load circuit 422 and includes transistors M415-M416. In one embodiment, the transistors M415, M416 are low-voltage transistors. The sources of the transistors M415-M416 receive the second power supply voltage V_33. The drains of the transistor M415-M416 are coupled to the drains of the transistor M412, M414 to provide the bias current for the load circuit 422. The transistors M415, M416, M230, and M232 form a current mirror circuit. In one embodiment, the transistors M415, M416 are P-type MOSFETs. In one embodiment, the control stage 440 also includes a switch MS41 to control the current source 424. In one embodiment, the switch MS41 is a low-voltage transistor. The source of the switch MS41 is supplied with the second power supply voltage V_33. The gate of the switch MS41 receives the enable signal ENA. The drain of the switch MS41 is coupled to the commonly coupled gates of the transistor M415, M416. In one embodiment, the switch MS41 is a P-type MOSFET.

Figure 5:
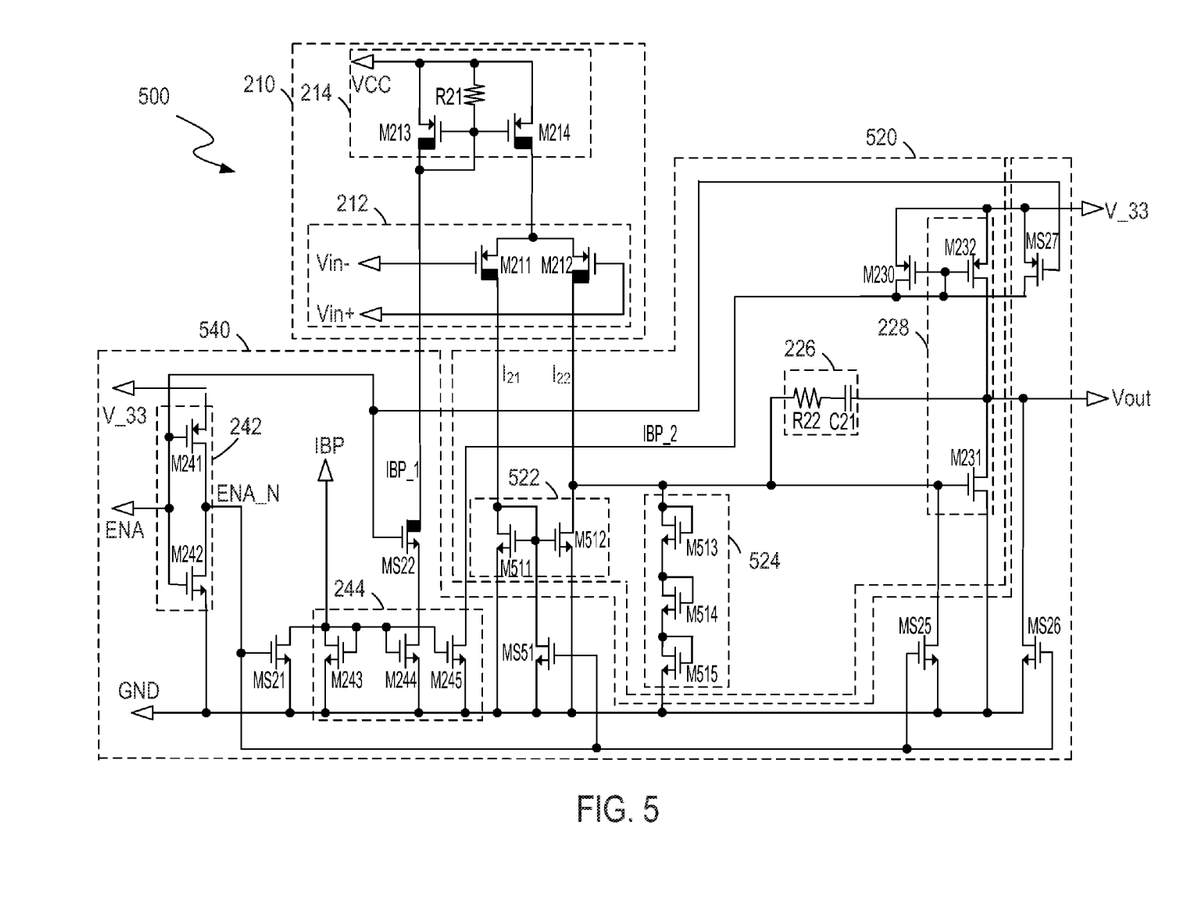
FIG. 5 illustrates a schematic diagram of an operational amplifier according to a fourth embodiment of the present invention.

FIG. 5 illustrates a schematic diagram of an operational amplifier 500 according to one embodiment of the present invention. Elements labeled the same as in FIGS. 1-4 have similar functions. In the example of FIG. 5, the operational amplifier 500 includes the input stage 210, an output stage 520 and a control stage 540. The input stage 210, output stage 520, and control stage 540 correspond to the input stage 110, output stage 120, and control stage 130 of FIG. 1.

In comparison to the output stage 220 in the FIG. 2, a load circuit 522 in the output stage 520 is a current mirror that includes the transistors M511 and M512. In one embodiment, the transistors M511, M512 are low-voltage transistors. The sources of the transistors M511-M512 are grounded. The drains of the transistors M511, M512 are coupled to the input stage 210 to receive the differential input currents $I_{21}$ and $I_{22}$, respectively. The drain of the transistor M511 is also coupled to commonly coupled gates of the transistors M511 and M512 to implement a current mirror. The load circuit 522 receives the differential input currents $I_{21}$, $I_{22}$, and outputs a single-ended output voltage signal Vout. In one embodiment, the transistors M511, M512 are N-type MOSFETs.

In one embodiment, the output stage 520 also includes a clamp circuit 524 that includes the transistors M513-M515. In one embodiment, the transistors M513-M515 are low-voltage transistors. The clamp circuit 514 is configured to clamp the single-ended output voltage signal Vout to a voltage level less than the maximum withstand voltage that can be applied between the gate and the source of the low-voltage transistors, e.g., 5.5V, to protect the transistors M512 and M231. In one embodiment, the gate and drain of the transistor M513 are coupled to the output of the load circuit 512. The gate and drain of the transistor M514 are coupled to the source of the transistor M513. The gate and drain of the transistor M515 are coupled to the source of the transistor M514. The source of the transistor M515 is grounded. In one embodiment, the transistors M513-M515 are N-type MOSFETs.

In one embodiment, the control stage 540 includes a switch MS51 that can be used to control the load circuit 522. In one embodiment, the switch MS51 is a low-voltage transistor. The source of the switch MS51 is grounded. The gate of the switch MS51 receives the inverted enable signal ENA_N. The drain of the switch MS51 is coupled to the commonly coupled gates of the transistors M511-M512. In one embodiment, the switch MS51 is an N-type MOSFET.

Figure 6:
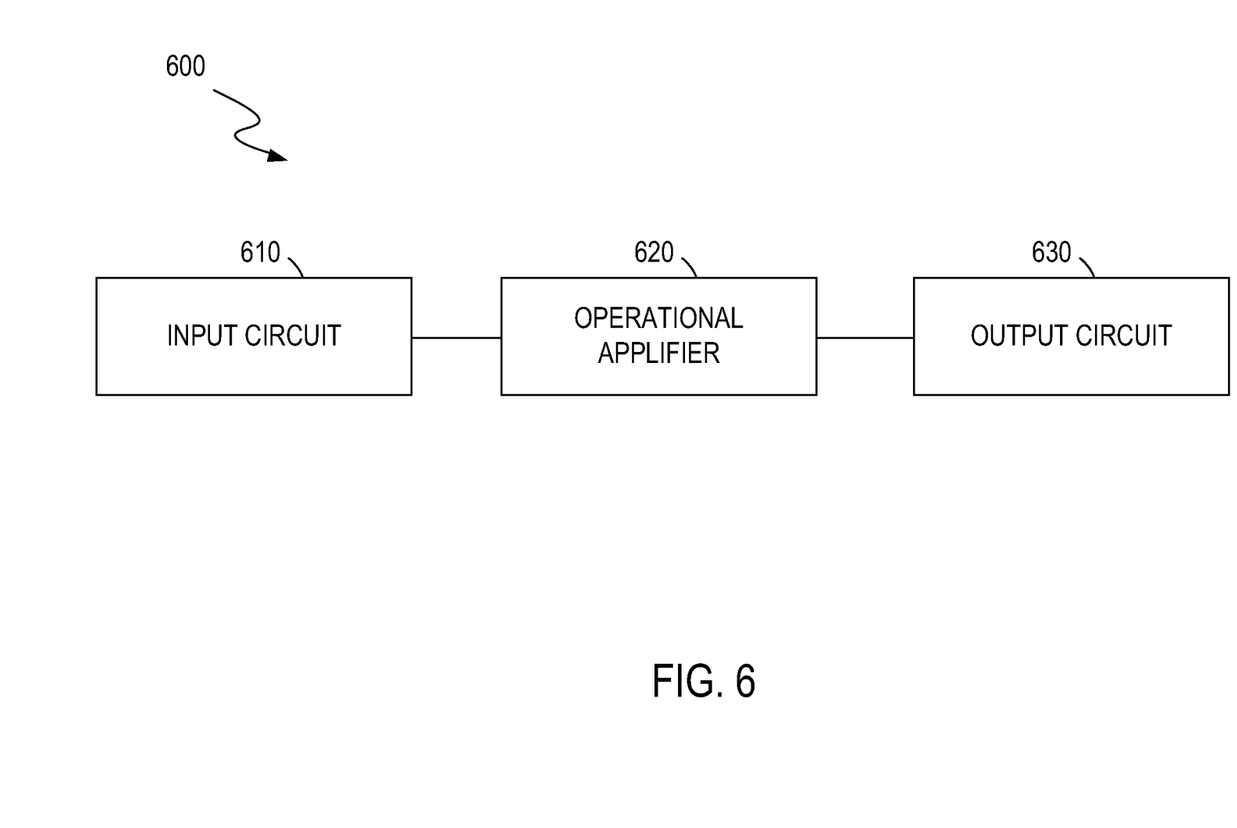
FIG. 6 illustrates a block diagram of a system for amplifying differential input voltage signal according to one embodiment of the present invention.

FIG. 6 illustrates a block diagram of a system 600 that can be used to amplify differential input voltage signals Vin+ and Vin− according to one embodiment of the present invention. The system 600 includes an input circuit 610, an operational amplifier 620, and an output circuit 630. The input circuit 610 is configured to generate the differential input voltage signals. The operational amplifier 620 receives and amplifies the differential input voltage signals, and outputs a single ended output voltage signal. The operational amplifier 620 includes an input stage, an output stage, and a control stage. The operational amplifier 620 can employ any of the circuits illustrated in FIGS. 2-5. The output circuit 630 receives the single-ended output voltage signal Vout for further processing.

Figure 7:
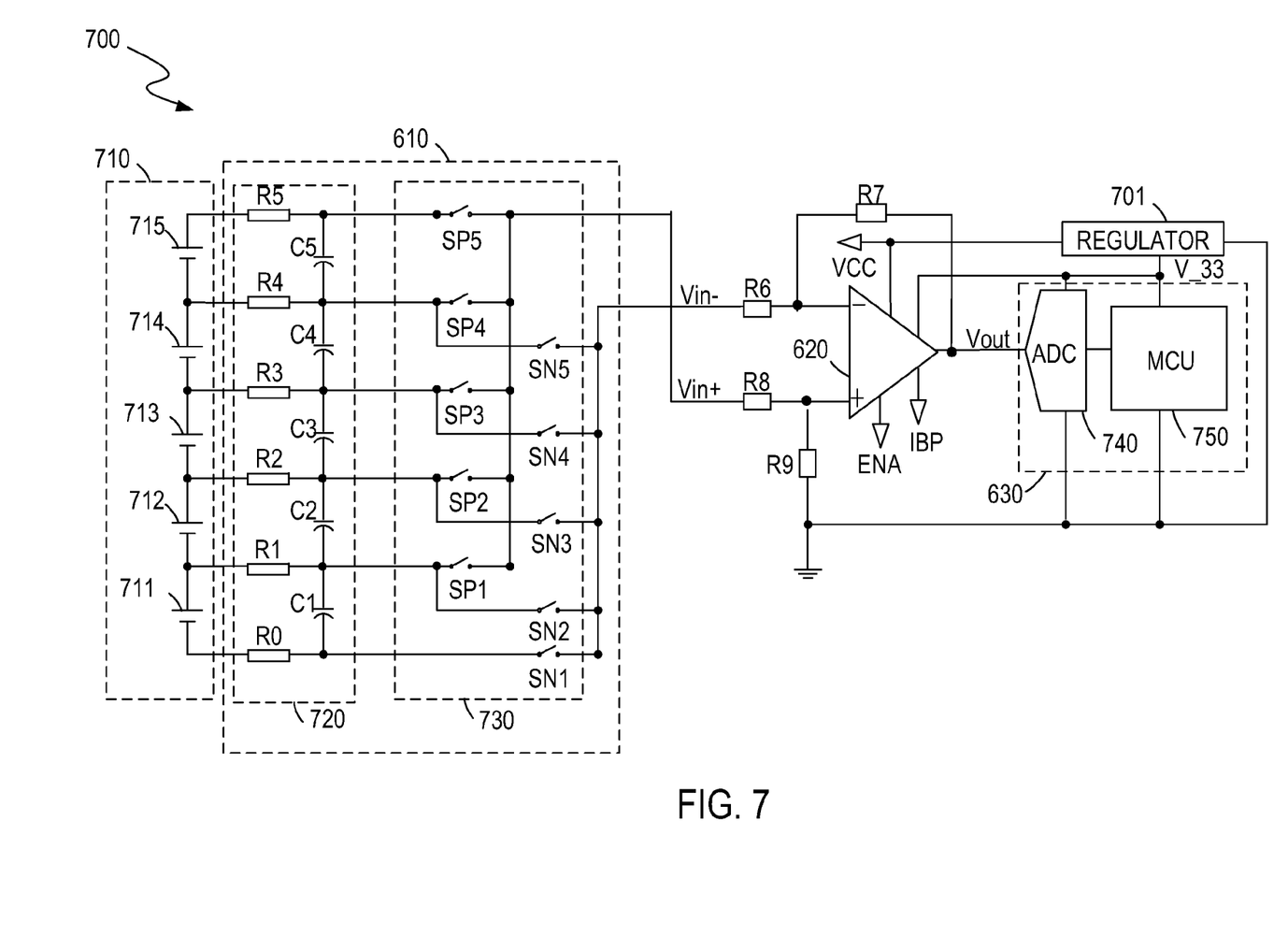
FIG. 7 illustrates a battery management system according to one embodiment of the present invention.

FIG. 7 illustrates a battery management system 700 according to one embodiment of the present invention. Elements labeled the same as in FIG. 6 have similar functions. The battery management system 700 includes the input circuit 610, the operational amplifier 620, and the output circuit 630. In one embodiment, the system 700 is employed to detect cell voltages of the battery 710, which includes a plurality of battery cells. For illustration purposes, in the example of FIG. 7, the battery 710 includes five battery cells 711-715 in series. In other embodiments, the battery 710 can include any number of cells.

The input circuit 610 is coupled to the battery 710 and can be used to generate differential input voltage signals Vin+, Vin− indicative of a cell voltage of a battery cell selected from the battery cells 711-715. In one embodiment, the input circuit 610 includes a connection circuit 720 and a selection circuit 730. The connection circuit 720 includes resistors R1-R5 coupled in parallel and capacitors C1-C5 coupled in series. The selection circuit 730 includes a first plurality of switches SP1-SP5 and a second plurality of switches SN1-SN5. The selection circuit 730 selects a battery cell in the battery 710 via the connection circuit 720 and delivers differential input voltage signals Vin+, Vin− indicative of a cell voltage of the selected battery cell to the operational amplifier 620.

The operational amplifier 620 is coupled to the input circuit 610 to receive and amplify the differential input voltage signals Vin+, Vin− indicative of a cell voltage of the selected battery cell, and outputs a single-ended output voltage signal Vout to the output circuit 630. An inverting input terminal of the operational amplifier 620 is coupled to the second plurality of switches SN1-SN5 of the selection circuit 730 to receive the input signal Vin− via a resistor R6, and is also coupled to the output terminal of the operational amplifier 620 via a resistor R7 to function as a negative feedback loop. In one embodiment, the non-inverting input signal of the operational amplifier 620 is coupled to the first plurality of switches SP1-SP5 of the selection circuit 730 via a resistor R8 to receive the input signal Vin+, and is grounded via a resistor R9. In one embodiment, the operational amplifier 620 receives an enable signal ENA and a bias current IBP, and is powered by a first power supply voltage VCC and a second power supply voltage V_33. In one embodiment, the second power supply voltage V_33 is less than the first power supply voltage VCC. In one embodiment, a regulator 701 regulates the first power supply voltage VCC to generate the second power supply voltage V_33.

The total voltage of the battery 710 may be about 20V, for example. The total voltage of the battery 710 is used as the first power supply voltage VCC. The regulator 701 regulates the first power supply voltage VCC to output a regulated voltage of about 3.3V, which can be used as the second power supply voltage V_33. In one embodiment, the ratio of a resistance of the resistor R6 to the resistance of the resistor R7 is 1:1, and the ratio of a resistance of the resistor R8 to the resistance of the resistor R9 is 2:1. The selection circuit 730 selects a battery cell by switching on two switches that correspond to the battery cell while other switches remain off. For example, by switching on the first switch SP5 and the second switch SN5 with the other switches off, the battery cell 715 is selected by the selection circuit 730. Therefore, the differential input voltage signals Vin+, Vin− of the operational amplifier 620 are indicative of a cell voltage of the battery cell 715. If the total voltage of the battery 710 is about 20V, for example, and the ratio of the resistance of the resistors R8 to the resistance of the resistor R9 is 2:1, a common-mode input voltage level at the non-inverting input terminal and the inverting input terminal of the operational amplifier 722 is about 6.6V. That is, the common-mode input voltage level at the non-inverting input terminal and the inverting input terminal of the operational amplifier 722 is higher than the second power supply voltage V_33 (e.g., 3.3V). A conventional operational amplifier needs to be powered by a power supply voltage (e.g., the first power supply voltage VCC) which is higher than the common-mode input voltage level, and cannot be powered by a power supply (e.g., the second power supply voltage V_33) which is lower than the common-mode input voltage level. As such, a conventional operational amplifier uses high-voltage transistors, which have a relatively large area and a relatively poor performance. The conventional operational amplifier also needs a level-shift circuit for increasing a voltage level of a control signal to shut off those high-voltage transistors.

The output circuit 630 receives the single-ended output voltage signal Vout and determines the cell voltage of the selected battery cell. Because the ratio of the resistance of the resistor R6 to the resistance of the resistor R7 is 1:1, the single-ended output voltage signal Vout is equal to the difference between the differential input voltage signals Vin+ and Vin. In one embodiment, the output circuit 630 includes an analog/digital (A/D) converter 740 and a micro control unit (MCU) 750. The A/D converter 740 is coupled to the output termimal of the operational amplifier 620 and converts the analog single-ended output voltage signal Vout to a digital voltage reading. The MCU 750 is coupled to the A/D converter 740 and processes the voltage reading to determine the cell voltage of the selected battery cell. In one embodiment, the MCU 750 is also operable for performing various functions based on the cell voltage of the selected battery cell, such as battery charging controlling and protection.

Advantageously, by employing the high-voltage transistors in the input stage of the operational amplifier and the low-voltage transistors in the output stage of the operational amplifier, the input stage is powered by a first power supply voltage and the output stage is powered by a second power supply voltage that is lower than the first power supply voltage. Compared with the conventional techniques, it is not necessary to employ an additional level-shift circuit to increase a voltage level of a control signal (e.g., the enable signal ENA) to control the operational amplifier. As a result, the area, the cost and the power consumption of the operational amplifier are reduced. Furthermore, because low-voltage transistors can be used in lieu of high-voltage transistors in the output stage, parasitic parameters are reduced, improving performance of the operatinal amplifier.

While the foregoing description and drawings represent embodiments of the present invention, it will be understood that various additions, modifications and substitutions may be made therein without departing from the spirit and scope of the principles of the present invention. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, and not limited to the foregoing description.

What is claimed is:

1. An operational amplifier comprising:
   an input stage comprising:
   a first current source operable for generating a first bias current, and
   a differential input circuit operable for receiving said first bias current and differential input voltage signals, and operable for converting said differential input voltage signals to differential input currents, wherein said input stage is supplied by a first power supply voltage;
   an output stage comprising:
   a load circuit coupled to said differential input circuit and operable for receiving said differential input currents and for outputting a single-ended output voltage signal, wherein said output stage is supplied by a second power supply voltage, and wherein said second power supply voltage is lower than said first power supply voltage,
   wherein the operational amplifier further comprises a control stage operable for receiving a second bias current and an enable signal, and operable for controlling said input stage and said output stage based on said enable signal and for generating a third bias current and a fourth bias current based on said second bias current, wherein said control stage is supplied by said second power supply voltage.

2. The operational amplifier of claim 1, wherein said input stage comprises a first plurality of transistors and said output stage comprises a second plurality of transistors, wherein operating voltage thresholds of said second plurality of transistors are lower than operating voltage thresholds of said first plurality of transistors.

3. The operational amplifier of claim 1, wherein said control stage further comprises a current mirror circuit operable for receiving said second bias current and generating said third bias current and said fourth bias current, wherein said third bias current is delivered to said first current source for generating said first bias current, and said fourth bias current is delivered to said output stage.

4. The operational amplifier of claim 3, wherein said control stage further comprises a switch coupled between said first current source and said current mirror circuit, wherein said switch is operable for isolating said first power supply voltage and said second power supply voltage, said switch also operable for receiving said enable signal, wherein said switch enables said third bias current to be delivered to said first current source if said enable signal is set to a first voltage level, and wherein said switch prevents said third bias current from being delivered to said first current source if said enable signal is set to a second voltage level.

5. The operational amplifier of claim 1, wherein said output stage further comprises a second current source operable for receiving said fourth bias current and for generating a fifth bias current to said load circuit.

6. The operational amplifier of claim 1, wherein said output stage further comprises an amplifier coupled to said load circuit, said amplifier operable for amplifying said single-ended output voltage signal.

7. The operational amplifier of claim 1, wherein said output stage further comprises a clamp circuit coupled to said load circuit, said clamp circuit operable for clamping said single-ended output voltage signal to a predetermined voltage.

8. An operational amplifier comprising:
   a differential input circuit operable for receiving differential input voltage signals and for converting said differential input voltage signals to differential input currents, wherein said differential input circuit comprises a first plurality of transistors;
   a first current source coupled to said differential input circuit, and operable for providing a first bias current for said differential input circuit, wherein said first current source comprises a second plurality of transistors;
   a load circuit coupled to said differential input circuit and operable for receiving said differential input currents and for outputting a single-ended output voltage signal, wherein said load circuit comprises a third plurality of transistors; wherein operating voltage thresholds of said third plurality of transistors are lower than operating voltage thresholds of said first and second plurality of transistors;
   a second current source operable for providing a second bias current for said load circuit, wherein said second current source comprises a fourth plurality of transistors; wherein operating voltage thresholds of said fourth plurality of transistors are lower than operating voltage thresholds of said first and second plurality of transistors; and
   a current mirror circuit operable for receiving a third bias current and generating a fourth bias current and a fifth bias current based on said third bias current, wherein said fourth bias current is delivered to said first current source to generate said first bias current, and said fifth bias current is delivered to said second current source to generate said second bias current.

9. The operational amplifier of claim 8, wherein said first current source and said differential input circuit are supplied by a first power supply voltage, and said load circuit and said second current source are supplied by a second power supply voltage, wherein said second power supply voltage is less than said first power supply voltage.

10. The operational amplifier of claim 8, further comprising a switch coupled between said current mirror circuit and said first current source, said switch operable for isolating a first power supply voltage and a second power supply voltage, said switch also operable for receiving an enable signal to control said fourth bias current; wherein said switch enables said fourth bias current to be delivered to said first current source if said enable signal is set to a first voltage level; and wherein said switch prevents said fourth bias current from being delivered to said first current source if said enable signal is set to a second voltage level.

11. The operational amplifier of claim 8, further comprising:
    an amplifier coupled to said load circuit, said amplifier operable for amplifying said single-ended output voltage signal, wherein said amplifier comprises a fourth plurality of transistors; wherein operating voltage thresholds of said fourth plurality of transistors are lower than operating voltage thresholds of said first and second plurality of transistors.

12. The operational amplifier of claim 8, further comprising:
    a clamp circuit coupled to said load circuit, said clamp circuit operable for clamping said single-ended output voltage signal to a predetermined voltage; wherein said clamp circuit comprises a fourth plurality of transistor; wherein operating voltage thresholds of said fourth plurality of transistors are lower than operating voltage thresholds of said first and second plurality of transistors.

13. A battery management system comprising:
an input circuit for generating differential input voltage signals indicative of a battery cell voltage;
an operational amplifier coupled to said input circuit and operable for receiving and amplifying said differential input voltage signals, and operable for converting said differential input voltage signals to a single-ended output voltage signal, wherein said operational amplifier comprises an input stage powered by a first power supply voltage and an output stage powered by a second power supply voltage, wherein said second power supply voltage is lower than said first power supply voltage; and
an output circuit coupled to said operational amplifier, and operable for receiving said single-ended output voltage signal and determining said battery cell voltage based on said single-ended output voltage signal,
wherein said operational amplifier comprises:
an inverting input terminal coupled to said input circuit via a first resistor, said inverting input terminal operable for receiving one of said differential input voltage signals via said first resistor;
a non-inverting input terminal coupled to said input circuit via a second resistor, and coupled to ground via a third resistor; wherein said non-inverting input terminal is operable for receiving another one of said differential input voltage signals via said second resistor; and
an output terminal coupled to said inverting input terminal via a fourth resistor to constitute a negative feedback loop, and operable for outputting said single-ended output voltage signal to said output circuit.

14. The system of claim 13, wherein said input stage comprises:
a current source operable for generating a bias current, wherein said current source comprises a first plurality of transistors; and
a differential input circuit coupled to said current source to receive said bias current, said differential input circuit operable for receiving differential input voltage signals and for converting said differential input voltage signals to differential input currents; wherein said differential input circuit comprises a second plurality of transistors;
wherein said output stage comprises:
a load circuit coupled to said differential input circuit, and operable for receiving said differential input currents and outputting said single-ended output voltage signal;
wherein operating voltage thresholds of said third plurality of transistors are lower than operating voltage thresholds of said first and second plurality of transistors.

15. The system of claim 13, wherein said input circuit comprises:
a connection circuit coupled to a battery comprising a plurality of battery cells; and
a selection circuit coupled between said connection circuit and said amplifier, said selection circuit operable for selecting a battery cell from said battery and for delivering said differential input voltage signal indicative of a cell voltage of said selected battery cell to said operational amplifier.

16. The system of claim 13, wherein said output circuit comprises:
an analog/digital converter coupled to said operational amplifier, said analog/digital converter operable for converting said single-ended output voltage signal from analog to a digital voltage reading; and
a micro control unit coupled to said analog/digital converter, said micro controller unit operable for determining said cell voltage of said selected battery cell based on said digital voltage reading.

* * * * *